US006515352B1

(12) United States Patent
Spielberger et al.

(10) Patent No.: US 6,515,352 B1
(45) Date of Patent: Feb. 4, 2003

(54) SHIELDING ARRANGEMENT TO PROTECT A CIRCUIT FROM STRAY MAGNETIC FIELDS

(75) Inventors: Richard K. Spielberger, Maple Grove, MN (US); Romney R. Katti, Maple Grove, MN (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 09/668,922

(22) Filed: Sep. 25, 2000

(51) Int. Cl.[7] ............................................. H01L 23/552
(52) U.S. Cl. ....................................... 257/659; 257/660
(58) Field of Search .................................. 257/659, 660

(56) References Cited

U.S. PATENT DOCUMENTS

| 4,953,002 A | | 8/1990 | Nelson et al. | |
|---|---|---|---|---|
| 5,561,265 A | | 10/1996 | Livshits et al. | |
| 5,635,754 A | * | 6/1997 | Strobel et al. | 257/659 |
| 5,640,047 A | | 6/1997 | Nakashima | |
| 5,650,659 A | * | 7/1997 | Mostafazadeh et al. | 257/660 |
| 5,831,331 A | * | 11/1998 | Lee | 257/659 |
| 5,902,690 A | | 5/1999 | Tracy et al. | |
| 5,939,772 A | | 8/1999 | Hurst et al. | |
| 6,429,044 B1 | * | 8/2002 | Tuttle | 438/106 |

\* cited by examiner

*Primary Examiner*—Hoai Ho
*Assistant Examiner*—Andy Huynh
(74) *Attorney, Agent, or Firm*—Knobbe, Martens, Olson & Bear, LLP

(57) ABSTRACT

A shielding arrangement for protecting a circuit containing magnetically sensitive materials from external stray magnetic fields. A shield of a material having a relatively high permeability is formed over the magnetically sensitive materials using thin film deposition techniques. Alternatively, a planar shield is affixed directly to a surface of semiconductor die containing an integrated circuit structure.

17 Claims, 2 Drawing Sheets

SHIELDING ARRANGEMENT TO PROTECT A CIRCUIT FROM STRAY MAGNETIC FIELDS

BACKGROUND OF THE INVENTION

The present invention relates to shielding for semiconductor devices and, more particularly, to shielding for semiconductor devices having magnetic materials used therein which are to be protected from stray external magnetic fields.

Magnetic materials are used, for example, in magnetic cell memories and magnetic field sensors. In random access magnetoresistive memories, storing data is accomplished by applying magnetic fields and thereby causing a magnetic material in a cell to be magnetized into either of two possible memory states. Recalling data is accomplished by sensing resistance changes in the cell when magnetic fields are applied. The magnetic fields are created by passing currents through strip lines (word lines) external to the magnetic structures, or through the magnetic structures themselves (sense lines).

Material layers which have a high magnetic permeability have been used in monolithic integrated circuits as a basis for magnetic cell memories. Early magnetic memory cells used a magnetic permeable layer formed of a thin film of a metallic alloy composition which, for example, might include nickel, cobalt, and iron. The films are fabricated in the course of the fabrication procedures for monolithic integrated circuits with some added steps. The films so fabricated usually exhibit uniaxial anisotropy magnetoresistance, and the materials used to form such films are known as AMR materials. More recently, magnetic memory cells have been formed as narrow stripes etched into a inhomogeneous conductor, for example, a multi-layer thin film stack permalloy-copper-permalloy. Such memory cells exhibit a pronounced decrease in electrical resistance when an applied magnetic field brings the magnetic moments in different regions into alignment. The materials used to form these more recent memory cells are referred to as Giant Magnetoresistance (GMR) materials. Because very large demagnetizing fields would otherwise result, the magnetization of such thin films, whether AMR materials or GMR materials, will always lie substantially in the plane of the film; that is, the magnetization vector for the material will be substantially in the plane of the film. The orientation of the easy axis of magnetization can be chosen if the film is deposited in the presence of a magnetic field oriented in the selected direction.

The magnetization of thin films formed of either AMR or GMR materials will always lie substantially in the plane of the film, that is, the magnetization vector for the material will be substantially in the plane of the film. The orientation of the easy-axis axis of magnetization can be chosen if the film is deposited in the presence of a magnetic field oriented in the selected direction.

Magnetic field sensors are typically configured as a Wheatstone bridge configuration. That is, all four legs of the bridge lie in a plane and change resistance proportional to an applied magnetic field.

A shield for protection from magnetic fields may be formed of a metal having a relatively high permeability. One such metal which is well known for use in magnetic shielding, and has a high initial permeability, is known as Mu metal and is available from Carpenter Technology Corporation, Carpenter Steel Division. Such alloys are referred to generally as Mu metal and are available from other sources.

U.S. Pat. No. 4,953,002 entitled "Semiconductor Device Housing with Magnetic Field Protection" dated Aug. 28, 1990 and assigned to Honeywell Inc., describes a housing for integrated circuit structures containing magnetic thin film which has permeable protective layers parallel to the thin film. U.S. Pat. No. 5,939,772 entitled "Shielded Package For Magnetic Devices" dated Aug. 17, 1999 and assigned to Honeywell Inc., describes the use of permeable metal shields attached by epoxy to the outside of a high-reliability hermetic package. If the shields had been located in the die cavity, exposure of the epoxies to the high assembly temperatures could have liberated large amounts of moisture, which would have resulted in early failure of the integrated circuit.

When a magnetic field shield is located outside the package, the shield extends beyond the underlying magnetizable material by an amount that is somewhat related to the spacing of the shield from the magnetizable material. For example if the distance from the plane of the magnetizable material to the plane of the shield is 0.015 inches, then the size of the shield may be selected so that it extends beyond the magnetizable material by two or three times this amount or 0.030 to 0.045 inches. Therefore it is desirable to locate the shield as close as possible to the magnetizable material so as to minimize the use of shield material and the associated weight and cost.

In integrated circuit devices having such permeable thin films, the orientation of the magnetization vector in the plane is usually important to the operation of the device. In accord with thermodynamics, the magnetization in such a film will arrange itself to minimize the magnetic energy. Magnetic fields external to the film will often be generated in and about the device as part of the device operation. These fields must be oriented to have components in the plane of the magnetic thin films to have a significant effect on the magnetization of such films in accord with minimizing the magnetic energy. Fields perpendicular to the films will have no effect on such magnetization.

With regard to stray magnetic fields, i.e., those magnetic fields which are generated from sources external to the film and to the integrated circuit device and its housing, there will be a desire in many instances that part or all of them have no significant effect on these permeable films. This is particularly true in the case of memory devices where the information contained in the memory is contained in the orientations of the magnetization vectors of the magnetic material used in each memory cell. Any such external magnetic field effects which would alter the orientations of the magnetization vectors in the memory cells could contribute to a loss of information or to erroneous information being provided by the memory. Recent improvements in magnetic film memories may lead to their widespread use in commercial devices. Therefore, such films need to be protected from external magnetic field disturbances, but the integrated circuit structures must also be housed in such a way to minimize cost if they are to be a viable product for the commercial memory market. Therefore, a shielding arrangement to protect magnetic films in such integrated circuit structures from significant external adverse influences, including external magnetic fields, and which can be economically provided, would be desirable.

For military, space or other applications requiring a high reliability package, it is desirable to have a hermetically sealed package that is free from any internal organic materials such as epoxy materials that may liberate moisture. In applications such as the radiation environment of space, it is also desirable to have the metal parts within the package at $V_{ss}$ or ground potential.

Thus a need exists for a simple, lightweight, economical shielding arrangement for integrated circuits using magnetizable materials.

SUMMARY OF THE INVENTION

The present invention solves these and other needs by providing a shielding arrangement for protecting a circuit from stray magnetic fields, including a circuit die having an integrated circuit structure that contains a magnetizable material with its magnetization orientation confined substantially to a magnetization plane. In a first aspect, the die has a surface parallel to the magnetization plane. Magnetic shielding material located at the surface of the die is affixed to the die and is of a size to overlay the magnetizable material. In another aspect, the invention includes a magnetic field shield formed by thin film processing techniques. Multiple layers of magnetic field shielding may be used.

DESCRIPTION OF THE PREFERRED EMBODIMENT

Figure 1:
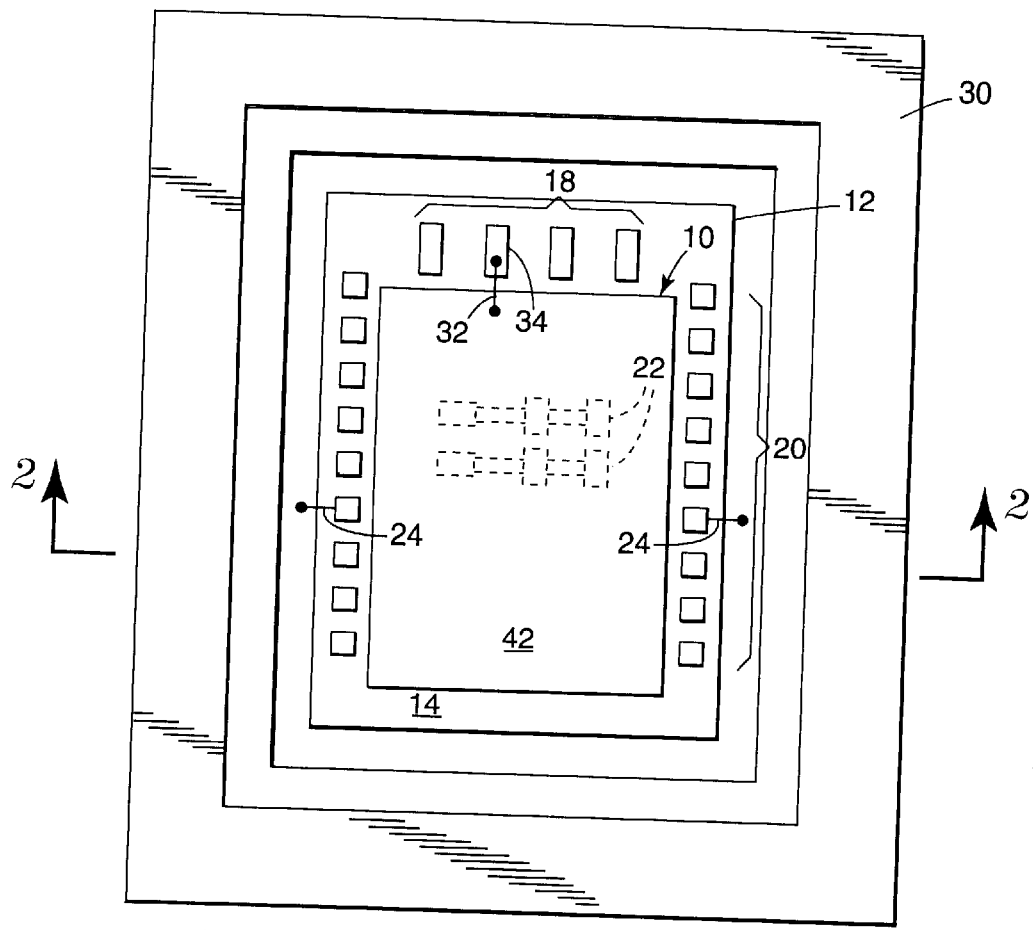
FIG. 1 shows a top plan view of a shielding arrangement according to the teachings of the present invention.
Figure 2:
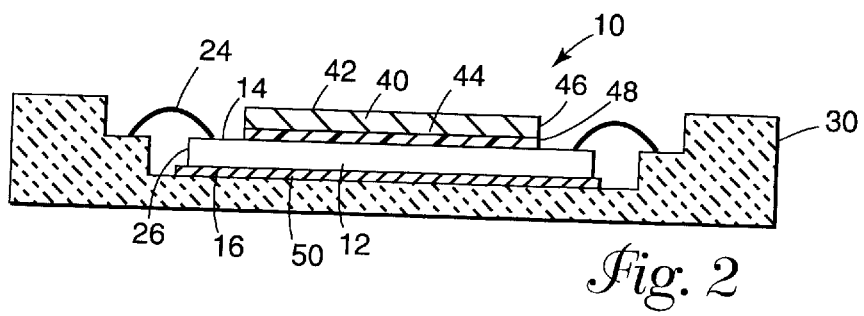
FIG. 2 shows a cross-sectional view of the shielding arrangement of FIG. 1 according to section line 2—2 of FIG. 1.

A shielding arrangement for protecting a circuit die containing a magnetically sensitive circuit from stray magnetic fields is shown in the drawings and generally designated 10. FIG. 1 shows a top plan view of an integrated circuit die 12 including upper surface 14, sides 26, lower surface 16, power supply pads 18, and signal input/output pads 20. Die 12 is shown in a ceramic package 30 after the die attach process. Die 12 further includes an area having an underlying magnetically sensitive circuit 22. Magnetically sensitive circuit 22 includes magnetizable material with its magnetization orientation confined substantially to a magnetization plane defined by the plane in which the magnetizable material lies. Surface 14 of die 12 is parallel to the magnetization plane 22. Electrical connections 24 in the form of wire bonds extend from bonding pads 20 to a connection site on package 30. Shielding arrangement 10 may take various forms and a single-chip packaging arrangement for a magnetoresistive memory device will be described first. In this shielding arrangement, shield 40 is a thin planar shield of Mu metal, for example, about 0.004 inches thick. Shield 40 includes top surface 42, bottom surface 44, and sides or edges 46. In accordance with the principles of the present invention, shield 40 is attached directly to surface 14 of die 12. Shield 40 is preferably attached to surface 14 using cyanate ester, which is available in paste form from Matthey Bishop Company and other suppliers. It is available for non-conductive applications or with silver loading for conductive applications. Attachment of shield 40 is typically done at about 150 degrees centigrade. Shields thicker or thinner than about 0.004 inches may, of course, be used.

Shield 40 is of a relatively high permeability material. Magnetic field portions oriented toward the sides 26 of die 12, and so in the magnetization plane, will tend to pass through shield 40 rather than through die 12 because of the high permeability of shield 40. In addition, there are distinct advantages to locating shield 40 as closely as possible to the plane of the magnetic materials. In magnetoresistive memory applications, the magnetic materials are formed after the underlying electronics are formed. The additional semiconductor operations necessary to form and pattern the magnetic materials of magnetizable circuit 22 necessarily place the magnetic materials very close to an upper surface of die 12 during processing. Therefore shield 40 is spaced very close to the plane of the magnetic materials and extends beyond the magnetic materials located below. Attaching the shield closer to surface 14 of die 12, and therefore closer to magnetization plane 22, allows the use of a thinner, lighter, and more economical shield than if a shield were located outside package 30, or if the shield were located beneath die 12 at surface 16. If a shield were located outside package 30, it would be spaced significantly from surface 14. If a shield were located beneath die 16, it would be spaced the thickness of die 12 from surface 14. Magnetic field portions which are oriented perpendicular to surface 14 and therefore to magnetic plane 22 will pass through die 12 and will not significantly affect the magnetization of magnetic materials in magnetizable circuit 22. As a result of the closeness of shielding arrangement 10 to the magnetization plane, magnetic field portions oriented toward sides 26 of die 12, and in the plane of magnetic materials, will tend to pass through shield 40, and it is believed that little fringing will occur in the plane of the magnetic materials.

The use of cyanate ester as a shield bonding material allows arrangement 10 to be exposed to elevated temperatures without liberating moisture, and cyanate ester will remain stable up to 350 degrees centigrade.

An additional shield 50 located at a lower surface 16 of die 12 may be used in some applications. However, depending on the application, the use of shield 40 attached directly to silicon surface 14 may provide sufficient shielding so that additional shield 50 is not needed.

When die 10 will operate in a radiation environment, for example in certain space applications, it may be desirable to ground shield 40. The present invention allows shield 40 to be conveniently connected by thin wire 32, or other means, directly to ground pad 34 on die 12.

Figure 3:
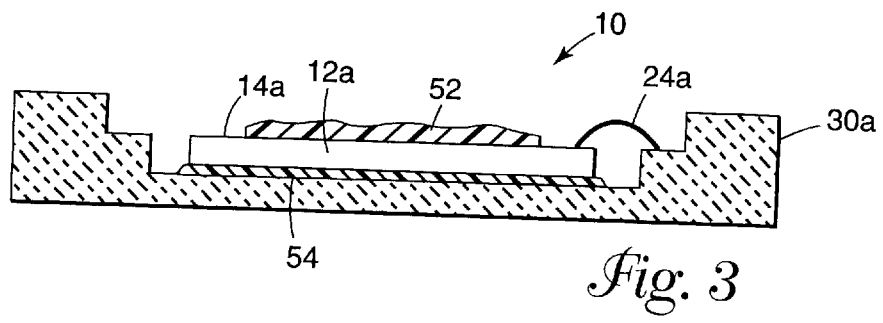
FIG. 3 shows a cross-sectional view of an alternate embodiment of the present invention.

An alternate embodiment of the shielding arrangement 10 is shown in FIG. 3 where reference numerals, e.g., 12a are used for similar parts. Material for shielding arrangement 10 may be prepared by dispersing a suitable shield metal powder in an organic carrier and binder to create a shield paste 52. Shield paste 52 could then be dispensed over a portion of upper surface 14a of die 12a and allowed to cure. The dispensing could occur after die attach or after wirebonding of leads to die 12a.

As shown in FIG. 3, shield paste could be used as the die attach agent 54 for die 12a and following either die attach or wire bonding operations, the paste could be applied over a portion of surface 14a.

The previously described embodiments have described the present invention relative to operations performed at the individual die level. Shielding arrangement 10 may also be implemented at the wafer level following passivation with, for example silicon dioxide or silicon nitride. These methods include dispersing a shielding material powder into a carrier and using a coating process to place the shielding material on the wafer. Some of the various methods of providing shielding arrangement 10 at the wafer level will be described by way of examples.

EXAMPLE 1

A suitable powder of shield metal in an organic carrier could be prepared into a slurry that could be silk screen printed and then cured. That is, the silk screening process would pattern the shield on the wafer to provide a shield for the individual die, while leaving electrical connections on the die accessible. Suitable metals include iron, cobalt, or nickel in the form of elements, alloys or oxides. The selection of the specific metal, the size of the particles, and the density of distribution may be used to control the shielding properties including permeability, flux concentration, and saturation limit. This method could occur after passivation of the wafer. The silk screening process could be used to only coat selected areas of the wafer.

Shielding arrangement 10 may also be implemented at the wafer level by employing semiconductor-processing techniques to form the magnetic field shielding material. The thin film deposition techniques may include evaporation, sputtering, ion-beam deposition, plasma vapor deposition or epitaxial methods.

EXAMPLE 2

Magnetic field shield material may be deposited on the wafer using photolithographic processing. For example, magnetic field shield material may be deposited and patterned using a shadow mask of a material such as molybdenum or chrome.

EXAMPLE 3

Magnetic shield material may be deposited onto the wafer in a blanket deposition. A photoresist material may then be coated onto the magnetic shield material and patterned using photolithography. Magnetic shield material may then be removed using wet or dry etching techniques so that magnetic shield material remains where desired.

EXAMPLE 4

A photoresist layer may be coated onto a wafer. The photoresist is exposed and etched so that photoresist is removed where magnetic shield material is desired. A magnetic shield material is then blanket deposited. The photoresist layer is then removed using a "lift-off" process to remove photoresist and magnetic shield material where the magnetic shield material is not desired.

EXAMPLE 5

A conductive seed metal layer is deposited on the wafer using a technique such as sputtering or evaporation. A magnetic material is then plated onto the seed layer. Photolithography is then used to pattern the magnetic shield material so that magnetic shield material remains where desired.

Now that some of the methods of implementing shielding arrangement 10 at the wafer level have been set forth, many advantages can be further set forth and appreciated.

Figure 4:
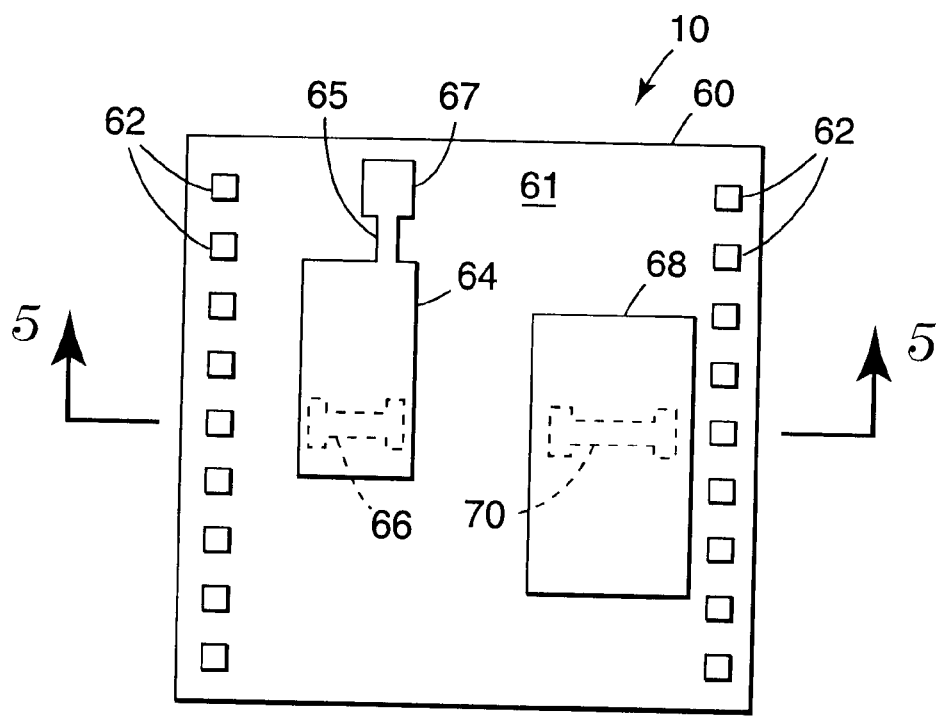
FIG. 4 shows a top plan view of an alternate embodiment of the present invention.
Figure 5:
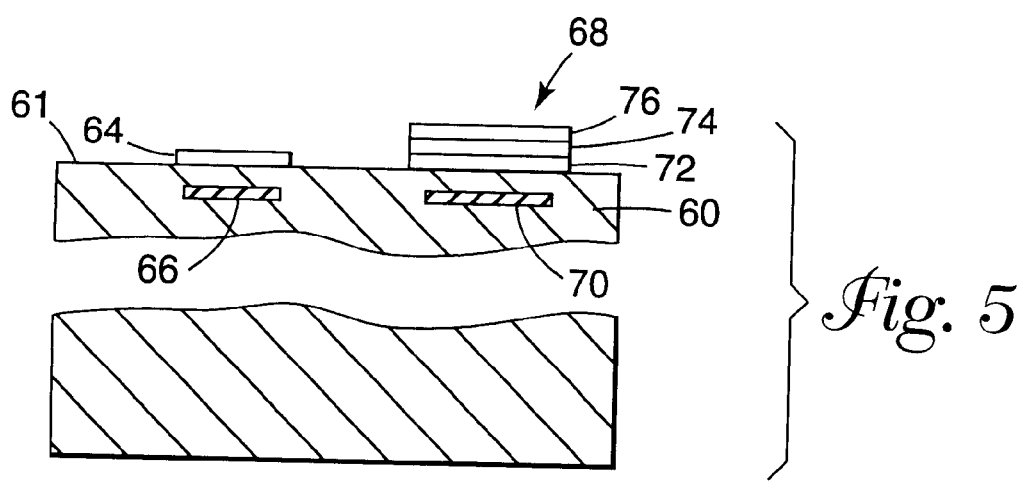
FIG. 5 shows a cross-sectional view of the shielding arrangement of FIG. 4 according to section line 5—5 of FIG. 4.

FIG. 4 shows a die 60 of semiconductor material containing an integrated circuit structure and having a surface 61 and including bonding pads 62. Die 60 includes magnetically-sensitive circuits having magnetizable material. Magnetic field shield 64 functions to shield magnetizable material 66, and magnetic field shield 68 functions to shield magnetizable material 70. Shield 64 consists of a single layer of magnetic field shielding material. Shield 64 includes a portion 65 connecting shield 64 to one of power supply ground pads 67. Shield 68 includes layers 72, 74, and 76. Magnetic field shield 64 and magnetic field shield portion 72 could have been formed from a single deposition layer, and could be formed of material that is electrically conductive or electrically insulative. Shield portion 74 of shield 68 could be an insulative material, and shield portion 76 could be an electrically conductive material. Shielding arrangement 10 provides flexibility to meet differing shielding needs. This flexibility allows shielding to be placed only on a portion of the die having underlying magnetizable material if so desired. The flexibility provides for variation in the number of shielding layers on different portions of the die. If time and frequency differences exist for signals in the magnetically sensitive circuits that are to be protected, then the nature of the shielding can be varied. This variation may result in using insulative magnetic field shielding material in high frequency circuits to reduce eddy current problems in the shielding material.

Shielding arrangement 10, whether utilizing an individual separable shield or a shield applied using semiconductor thin film processing techniques, provides a shield that is contiguous with the integrated circuit structure that is being protected.

Shielding arrangement 10 has been described with reference to a single chip ceramic layer package however it is equally applicable to other package types, e.g., multichip modules and low-cost plastic packages. For example, with the use of shield arrangement 10, a shield could be applied and the die could then be sent to any commercial packaging house to be packaged in plastic organic packages.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than the foregoing description, and all changes which come within the meaning and range of equivalency of the claims are intended to be embraced therein.

What is claimed is:

1. Shielding arrangement for protecting a circuit from stray magnetic fields comprising:
    an integrated circuit structure having therein a magnetizable material with its magnetization orientation confined substantially to a magnetization plane; and
    a first layer of magnetic field shielding material formed in a plane parallel to said magnetization plane and having a size to overlay said magnetizable material, said layer of magnetic field shielding material contiguous with said integrated circuit structure.

2. Shielding arrangement of claim 1 wherein said magnetic field shielding material is electrically insulative.

3. Shielding arrangement of claim 1 wherein said magnetic field shielding material is electrically conductive.

4. Shielding arrangement of claim 1, further comprising a second layer of magnetic field shielding material.

5. Shielding arrangement of claim 4 wherein said first layer and said second layer are separated by an intermediate electrically insulative layer.

6. Shielding arrangement of claim 3 wherein said first layer extends to an electrical connection site.

7. The shielding arrangement of claim 1 wherein said integrated circuit structure is a completed semiconductor die and said magnetic field shielding material comprises a planar metal shield having a relatively high permeability, said planar metal shield secured to a surface of said die by a bonding agent.

8. The shielding arrangement of claim 7 wherein said bonding agent comprises a cyanate ester.

9. The shielding arrangement of claim 8, further comprising an electrical connection extending from said magnetic shielding material to an electrical connection site on said die.

10. Shielding arrangement for protecting a circuit from stray magnetic fields comprising:
- an integrated circuit structure having therein a magnetizable material with its magnetization orientation confined substantially to a magnetization plane, said integrated circuit structure having a first surface parallel to said magnetization plane and electrical connection sites located at said first surface;
- magnetic field shielding material located at said first surface and having a size to overlay said magnetizable material while leaving said electrical connection sites accessible; and
- means for securing said magnetic field shielding material to said first surface.

11. The shielding arrangement of claim 10 wherein said magnetic field shielding material comprises a planar metal shield having a relatively high permeability.

12. The shielding arrangement of claim 10 wherein said means for securing said magnetic field shielding material to said first surface comprises a cyanate ester.

13. The shielding arrangement of claim 10, further comprising an electrical connection extending from said magnetic field shielding material to an electrical connection site external to said magnetic field shielding material.

14. The shielding arrangement of claim 13 wherein said electrical connection comprises a thin wire that extends to a ground pad at said integrated circuit structure.

15. The shielding arrangement of claim 10 wherein said magnetic field shielding material comprises a paste comprising small particles of a shield metal.

16. The shielding arrangement of claim 10 further comprising a paste of small particles of a magnetic field shielding material wherein said paste is used as a die attach material.

17. The shielding arrangement of claim 10 wherein said magnetic field shielding material is applied at the wafer level and comprises a layer of shield metal formed by semiconductor processing techniques.

* * * * *